United States Patent [19]

Sicard

[11] Patent Number: 4,992,836
[45] Date of Patent: Feb. 12, 1991

[54] DEVICE FOR CONTROLLING THE ELECTRICAL SUPPLY TO A LOAD, IN A "SMART" POWER INTEGRATED CIRCUIT

[75] Inventor: Thierry M. A. Sicard, Fenouillet, France

[73] Assignee: Siemens Aktiengesellschaft, Munich, Fed. Rep. of Germany

[21] Appl. No.: 324,164

[22] Filed: Mar. 15, 1989

[30] Foreign Application Priority Data

Mar. 16, 1988 [FR] France ................ 88 03374

[51] Int. Cl.$^5$ ......................................... H01L 29/90
[52] U.S. Cl. ........................ 357/13; 357/23.13; 357/34; 357/41; 357/23.4; 361/111
[58] Field of Search ............ 357/23.13, 13, 34, 41, 357/23.4; 307/544, 546; 361/111, 88, 93

[56] References Cited

U.S. PATENT DOCUMENTS 4,595,966  6/1986  Huber et al. ..................... 361/93
4,750,078  7/6198  Ganger et al. .................. 357/23.13

FOREIGN PATENT DOCUMENTS 2260869  5/1975  France .

Primary Examiner—Edward J. Wojciechowicz
Assistant Examiner—Sara W. Crane
Attorney, Agent, or Firm—Russel C. Wells; George L. Boller

[57] ABSTRACT

The device comprises a comparator (3) to diagnose a possible short-circuit of an inductive load (2), the supply to which is controlled by a power transistor (1) of the DMOS type. On blocking of the transistor (1), a high negative voltage appears at the terminals of the load, which is liable to damage the comparator (3). In order to protect the non-inverting input of the comparator, there is connected between said input and the load (2) a junction isolation "vertical" NPN transistor (8) exhibiting a reverse voltge Vebo greater than said negative voltage. The collector of the transistor (8) is connected to the supply +Vbat by the N-type substrate of a "smart" power integrated circuit, the emitter of the transistor (8) being isolated from the substrate by a P-type zone. Application to the control of an inductive load in automobile electronics.

8 Claims, 1 Drawing Sheet

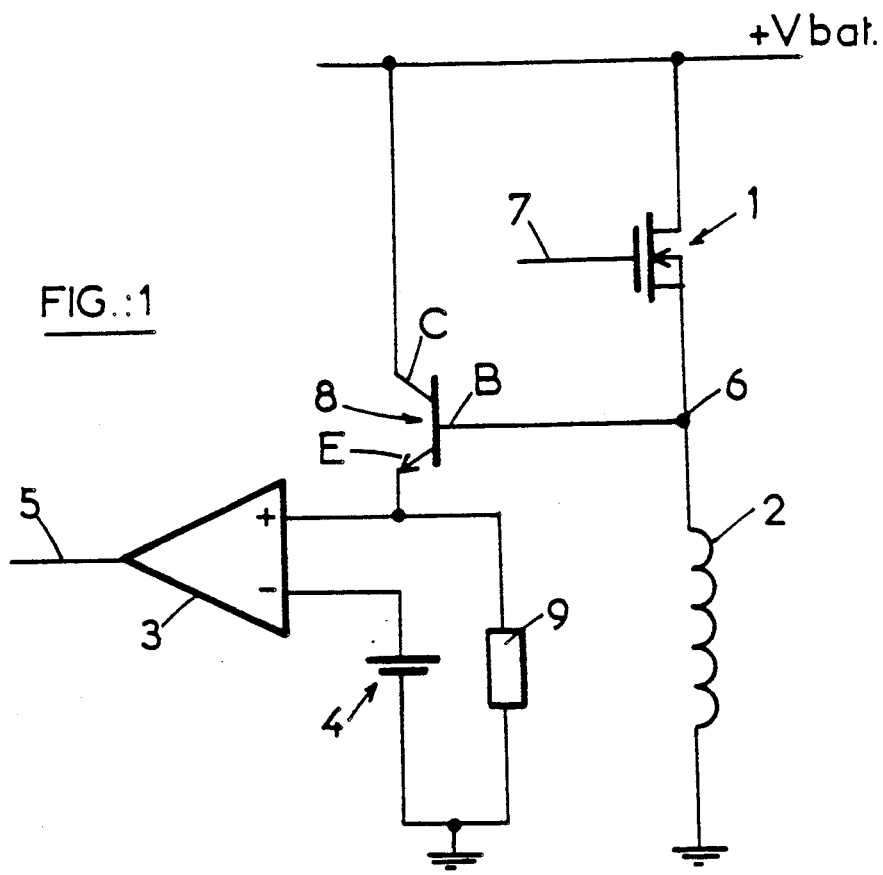
FIG.:1
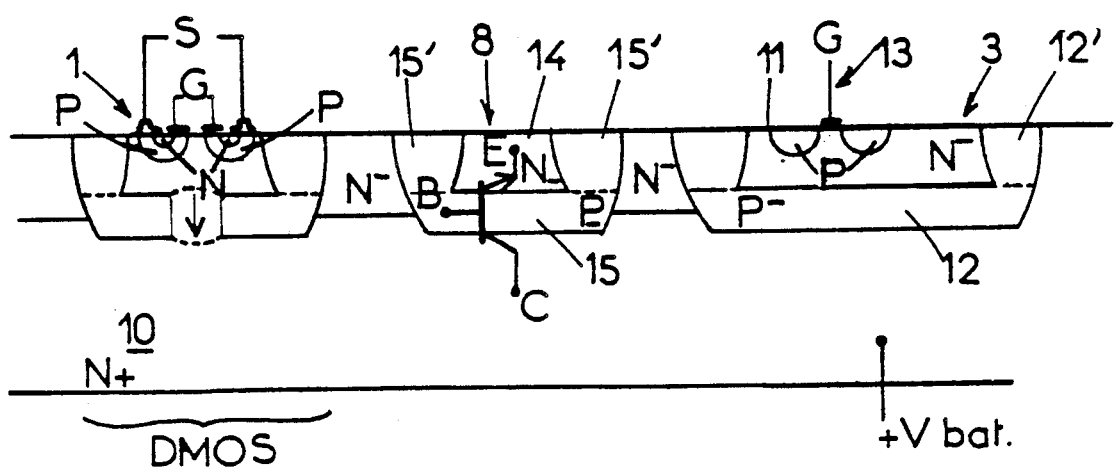
FIG.:2

DEVICE FOR CONTROLLING THE ELECTRICAL SUPPLY TO A LOAD, IN A "SMART" POWER INTEGRATED CIRCUIT

The present invention relates to a device for controlling the electrical supply to a load in a "smart" power integrated circuit, and more particularly to such a device controlling the supply through an inductive load.

The name of "smart power integrated circuits" covers integrated circuits combining on the same chip logic functions executed in MOS or bipolar technology, for example, and at least one DMOS or bipolar power component, for example. Various technologies for the construction of such integrated circuits have been developed, and these have led to products such as the SMARTMOS circuits of the United States company MOTOROLA, the S2P2 or VIP technology products of the Italian company SGS MICROELECTRONICA or the SMART SIPMOS products of the company SIEMENS AG of the Federal Republic of Germany.

Such "smart" power integrated circuits prove, in particular, to be well suited to the resolution of problems which arise in automobile electronics. In fact, functions such as the ignition, the control of the injection time, the modulation of the pressure in the braking circuits rely upon inductive loads, the supply to which must be controlled by power transistors. These power transistors are themselves controlled by low-current logic circuits which can be integrated, by virtue of these new "smart" circuits, on the same chip as the power transistor which controls the supply to the inductive load. As an example of such inductive loads, it is possible to mention the coil of an injector or that of a solenoid valve modulating a pressure of a brake fluid in a wheel antilock device. Again, it is possible to mention the coil of an' inductive ignition primary circuit.

The circuits controlling such inductive loads in an automobile environment are frequently equipped with diagnosis means permitting the detection, for example, of a disconnection or an accidental short-circuit of the inductive load rendering the latter inoperative, this taking place for safety reasons, for example. These means comprise electronics circuits which monitor the voltage prevailing at the terminals of the load in order to detect, for example, the possible appearance of a short-circuit and to trigger appropriate alarm or corrective action.

The high negative voltages which appear at the terminals of the inductive load when the supply circuit of this load is opened by the power transistor placed in series with this load are then liable to impair the components of the diagnostic circuit. If the latter comprises, for example, an amplifier constructed in MOS technology, the maximum gate-source or gate-drain voltages which can be accepted by the transistors of this amplifier are approximately 20 volts.

In an autombile environment, the opening of the circuit of the inductive load currently causes the appearance, at the terminals of the latter, of negative voltages in the order of 20 to 30 volts, to discharge rapidly the energy stored in the load, these being voltages which are liable to impair the MOS transistors of the diagnostic circuit. Accordingly, it is necessary to intercalate between the output of the load and the input of the amplifier a component to protect this amplifier.

The object of the present invention is to incorporate such a protective component in a device for controlling an inductive load, which device is constructed as a "smart" power integrated circuit.

The object of the present invention is also to construct such a device in which the protective component is associated with means for the diagnosis of the condition of an inductive load in order to protect them from the voltages generated by the opening of a supply circuit of this load.

These objects of the invention, as well as others which will become apparent in the text which follows, are achieved with a device for controlling electrical supply to a load, in a "smart" power integrated circuit, comprising a circuit sensitive to the voltage at the terminals of the load, a supply circuit of the load and a protective component installed between a terminal of the load and an input of the sensitive circuit to protect the latter from excess voltages developed at the terminals of the load, wherein this protective component consists of a "vertical" bipolar transistor integrated in the device and connected in accordance with the emitter-follower circuit on the input of the sensitive circuit in such a manner as to oppose its emitter-base junction of maximum breakdown reverse voltage $V_{ebo}$ to a maximum voltage $V_c$ less than $V_{ebo}$ developed at the terminals of the load in order to avoid any deterioration of the sensitive circuit.

In the acccompanying drawing, which is given purely by way of example;

FIG. 1 represents a basic diagram of a device for controlling an inductive load, which device is equipped with means for diagnosing a possible short-circuit of this load and with a component for protecting, according to the invention, these diagnostic means, and against excess voltages appearing at the terminals of the load and, FIG. 2 diagrammatically represents, in cross-section, a part of the internal structure of a "smart" power integrated circuit adapted for the utilisation of the control device of FIG. 1, protected according to the invention.

Reference is made to FIG. 1, in which the device represented comprises a "vertical" power transistor 1, in DMOS technology (or TMOS in accordance with the terminology adopted by the company MOTOROLA) for example, the drain-source circuit of which is placed in series with an inductive load 2, between the positive terminal +Vbat of a source of electrical energy and ground. In one of the automobile electronics applications mentioned hereinabove, this source of electrical energy is a battery carried on board and the ground is that of the vehicle. The inductive load may then consist of the coil of an injector controlling the quantity of fuel admitted into one cylinder or some cylinders of the motor of the vehicle. This may also be the coil of a solenoid valve modulating the pressure of a brake fluid forming part of a wheel antilock device of the vehicle, the coil of the primary of an ignition circuit etc. . . .

Such devices are ordinarily controlled by signals generated within an electronic module incorporating one or more microprocessors, from various input signals representing the regime of the motor, the inlet pressure, the speed of the wheels of the vehicle, etc. . . . In addition to the processing of these control signals, the module executes diagnostic functions concerning the condition of operation of the sensors or of the actuators (solenoid valves, injectors, etc. . . .). Among other diagnostic signals, the module is informed of the possible existence of a short-circuit of one of the inductive loads contemplated hereinabove, being a short-circuit which certainly prevents the actuator equipped with this load from operating correctly. A signal representing such a situation permits the module to trigger corrective actions, permitting the maintenance of a minimum security of operation of the equipment of the vehicle, for example.

A possible short-circuit of the load 2 is detected by comparing a reference voltage with a voltage sampled at the terminals of the load, when the transistor 1 conducts. If there is a short-circuit, the voltage at the terminals is virtually zero. This situation is detected by means, for example, of a sensitive circuit such as a differential amplifier 3 connected as a comparator, which received on its non-inverting input a signal representing the voltage at the terminals of the load 2 and on the inverting input a reference voltage signal generated, for example, by means of a voltage generator 4 connected between this input and ground. When, in the course of a diagnosis of the condition of the load 2, the voltage on the non-inverting input of the amplifier is less than the reference voltage, the logic level of the signal present on the output 5 of the amplifier 3 trips. This tripping of the signal is perceived by the electronic module as representing a condition of short-circuit of the load 2. Corrective actions are then possibly triggered by the module.

In an embodiment of the device according to the invention, the amplifier 3 is constructed with MOS transistors, the maximum acceptable gate-source or gate-drain voltage of which is approximately 20 volts. In the automobile electronics applications mentioned hereinabove, the voltage on the terminal 6 common to the transistor 1 and to the load 2 may fall to negative values Vc in the order of 20-30 volts, at the moment of a blocking of the MOS transistor 1 obtained by the application, to its gate 7, of an appropriate voltage signal emitted by the electronic module which controls the inductive or self-inductive load 2. It is then necessary to isolate the non-inveting input of the amplifier 3 from such negative voltages which might damage the MOS transistors forming part of this amplifier.

In order to do this, it would be possible to contemplate the intercalation of the emitter-based junction of a protective component consisting of a bipolar transistor 8 of NPN type and connected in emitter-follower between the load 2 and the non-inverting input of the amplifier. The base B of the transistor 8 is then connected to the terminal 6, the collector c is connected to the line +Vbat of the supply source, in the present case the battery of the vehicle, and the emitter E is connected to the non-inverting input of the amplifier 4, a load resistor 9 being connected between ground and the emitter of the transistor 8.

As has been seen hereinabove, a locking of the MOS transistor 1, triggered by a signal applied to its gate 7, causes the discharge of the electromagnetic energy stored in the coil 2. A negative voltage then appears on the base B of the transistor 8. If this negative voltage is less than the maximum reverse voltage Vebo which can be accepted by the emitter-base junction of the transistor 8, this junction prevents the application of this negative voltage to the non-inverting input of the amplifier 3, and thus any deterioration of the MOS transistors of this amplifier by a negative voltage which would be greater than the gate-source or gate-drain voltages which can be accepted by these transistors.

However, the value of the reverse breakdown voltage Vebo of a conventional NPN transistor does not exceed 6 volts, which is very much less than the voltages Vc of 20 to 30 volts mentioned hereinabove, which are currently observed between the terminals of the self-inductive load 2, on the opening of its supply circuit, Accordingly, such voltages cannot be accepted by the emitter-base junction of a conventional NPN transistor 8 which cannot then fulfil a function of protection in relation to the amplifier 3, whether or not the conventional NPN transistor 8 is incorporated in a "smart" power integrated circuit.

According to the invention, this difficulty is solved in the case of a device for controlling an inductive load, which device is constructed as a junction isolation "smart" power integrated circuit of vertical structure, making use of a "parasite" bipolar transistor defined in the structure of such a circuit.

This transistor is defined by a reverse voltage Vebo which may reach 60 volts, for example, in a SMART-MOS "smart" power circuit of the company MOTOROLA mentioned hereinabove. Thus, such a reverse voltage effectively protects the MOS transistors of the amplifier 3.

The invention will be better understood by referring to FIG. 2 of the drawing, which diagrammatically represents a corss-section of a part of the structure of a junction isolated "smart" power integrated circuit of vertrical structure, being a circuit which utilises the present invention.

By comparison with the structure of a conventional integrated circuit, a "smart" power circuit essentially comprises a supplementary layer 10 of N-type silicon, for example N+-type, forming a substrate, this substrate being connected to the positive terminal +Vbat of a source of electrical energy such as a battery of an automobile vehicle. On top of this substrate there is found a layer of N-type silicon, for example N−-type, obtained by epitaxial growth. In a region 11 of this layer, isolated by a P-type embedded layer 12 and isolated walls 12' of the same type obtained by diffusion, it is possible to implant various conventional electronic components especially MOS or bipolar transistors which are useful for the construction of the "control" part or of the "diagnostic" part of the self-inductive load control circuit of FIG. 1. By way of example, a representation has been given of a P channel MOS transistor 13 implanted in this region 11.

The integrated circuit structure represented in FIG. 2 also comprises a DMOS power transistor (or TMOS in accordance with the terminology adopted by the company MOTOROLA) which corresponds to the transistor 1 of FIG. 1. The great advantage of the "smart" power integrated circuits such as that diagrammatically represented in FIG. 2 is that of comprising both a power part (for example the DMOS transistor) and a "low currents" part corresponding to circuits operating on "small" signals to form signals which are useful for controlling the power part. This is the reason for their use in automobile electronics for controlling inductive loads.

According to the present invention, the amplifier 3 of the circuit for the diagnosis of the condition of the inductive load 2 of the device of FIG. 1 is protected from the high negative voltages appearing at the terminals of this load, on cutting off the current in the load, by a protective component consisting of a "vertical" transistor 8 defined in the thickness of the integrated circuit represented. FIG. 2 represents the various junctions of this transistor and, superposed, the conventional connections of a transistor to indicate how the various regions of this transistor are connected to the device of FIG. 1.

The transistor represented is of the NPN type. The substrate 10, of N+ type, of the integrated circuit constitutes the collector C of the transistor, which is thus connected to the line +Vbat of the supply. The emitter is formed by a well 14 of the N− layer formed by epitaxial growth, this well 14 being separated from the substrate by an embedded layer 15 and isolating walls 15' of P type, which are obtained by diffusion and which constitute the base of the transistor 8. It is understood that the current of the emitter-collector circuit of the transistor 8 then traverses the integrated circuit perpendicular to the external faces of the integrated circuit, as is moreover the case for the current controlled by the power transistor 1, of the DMOS type (whence the expression the "vertical transistor"). It will also be noted that the well 14 is isolated from the positive terminal +Vbat of the source of electrical energy by the base of the transistor 8, at the base-emitter junction of this "vertical" transistor. It is then stated in abbreviated terms that the "vertical" technology employed utilizes a junction isolation.

With the emitter-follower circuit of FIG. 1 utilized in a "smart" power integrated circuit of the type described hereinabove, it is observed that the base-emitter junction of the transistor 8, which junction is formed in the structure of the integrated circuit represented in FIG. 2, exhibits a reverse voltage Vebo in the order of 60 volts, on account of the low N− doping of the emitter 14 and of the low P− doping of the base 15. This reverse voltage is then very much greater than the reverse voltages, in the order of 20 to 30 volts, which are observed at the terminals of the inductive loads used in automobile electronics. Thus, the invention proposes to protect low-current circuits implanted in a "smart" ppwer integrated circuit by means of "vertical" transistors which are junction-isolated and implanted as represented in FIG. 2, in regions 14 and 15 of low doping.

When a terminal of a self-inductive load controlled by a "smart" power circuit is to be connected to a "low current" part such as the amplifier 3 of a diagnostic circuit associated with the self-inductive load 2 of the circuit of FIG. 1, the emitter-follower circuit of the transistor 8 of FIG. 2 effectively protects the noninverting input of this amplifier against negative voltages up to approximately 60 volts; this is broadly sufficient to prevent any deterioration of the diagnostic device in the course of the discharges of the actuator coils used in automobile electronics. Thus, according to the invention, an unexpected use is made of a transistor effect which is intrinsically contained within the multilayer structure of a "smart" power integrated circuit which has a vertical structure and which is junction-isolated, for example of the SMARTMOS type, according to the name used by the company MOTOROLA.

The invention is not, of course, limited to the embodiment described and represented, which has been given purely by way of example. A person skilled in the art will be able to adapt the control device described to types of transistors and to "smart" power integrated circuit structures other than that described, without departing from the scope of the invention. Likewise, the invention is not limited to the protection of a circuit for the diagnosis of the condition of the short-circuit of an inductive load. It is applicable to the protection of any sub-circuit liable to be impaired by an excess voltage appearing within a "smart" power circuit, due, for example, to a negative pulse induced on the output of the transistor for controlling the supply to a load of any type.

I claim:

1. A device for controlling the electrical supply to a load, in a "smart" power integrated circuit, comprising a circuit (3) sensitive to the voltage at the terminals of the load, a supply circuit of the load and a protective component installed between a terminal of the load and an input of the sensitive circuit to protect the latter from excess voltages developed at the terminals of the load, wherein this protective component comprises a "vetrtical" bipolar transistor (8) integrated in the device and connected in an emitter-follower circuit on the input of the sensitive circuit in such a manner as to oppose its emitter-base junction of maximum breakdown reverse voltage Vebo to a maximum voltage Vc less than Vebo developed at the terminals of the load (2) to avoid any deterioration of the sensitive circuit, said sensitive circuit being connected with the transistor's emitter and not with its base, and said load being connected with the transistor's base and not with its emitter.

2. The device as claimed in claim 1, wherein the protective, "vertical" bipolar transistor (8) is of the NPN type, the collector of the transistor (8) consisting of an N-type substrate (10) of a "smart" power integrated circuit including a substrate connected to the positive terminal of a supply source of the circuit and of the load, the emitter (14) of the transistor (8) consisting of an N-type surface well (14) of the circuit, the well being isolated from the substrate by a P-type region (15, 15') constituting the base of transistor (8).

3. A device for controlling the electrical supply to a load, in a "smart" power integrated circuit, comprising a circuit (3) sensitive to the voltage at the terminals of the load, a supply circuit of the load and a protective component installed between a terminal of the load and an input of the sensitive circuit to protect the latter from excess voltages developed at the terminal of the load, wherein this protective component comprises a "vertical" bipolar transistor (8) integrated in the device and connected in an emitter-follower circuit on the input of the sensitive circuit in such a manner as to oppose its emitter-base junction of maximum breakdown reverse voltage Vebo to a maximum voltage Vc less than Vebo developed at the terminals of the load (2) to avoid any deterioration of the sensitive circuit, wherein the protective, "vertical" bipolar transistor (8) is of the NPN type, the collector of the transistor (8) comprising an N-type substrate (10) of a "smart" power integrated circuit including a substrate connected to the positive terminal of a supply source of the circuit and of the load, the emitter (14) of the transistor (8) comprising an N-type surface well (14) of the circuit, the well being isolated from the substrate by a P-type region (15, 15') constituting the base of transistor (8), and wherein the load (2) is an inductive load, the supply to which is controlled by a power transistor (1) this load developing a negative voltage Vc on the base of the bipolar transistor (8) on blocking of the power transistor (1), this negative voltage Vc being less, in absolute value, than the maximum reverse voltage Vebo of the bipolar transistor (8).

4. The device as claimed in claim 3, wherein the power transistor (1) is of the "vertical" DMOS type.

5. The device as claimed in any one of claims 1 to 4, wherein the circuit (3) sensitive to the voltage at the terminals of the load is a circuit for the diagnosis of the condition of connection of this load.

6. The device as claimed in claim 5, wherein the diagnostic circuit is sensitive to a possible short-circuiting of the load.

7. The device as claimed in claim 6, wherein the diagnostic circuit comprises a differential amplifier (3) connected as a comparator, the non-inverting input of this amplifier being connected to the emitter of the protective transistor (8) while the inverting input is brought to a reference voltage, the amplifier delivering on its output (5) a signal signifying the existence of a short-circuit of the load (2) when the voltage on the non-inverting input falls below the reference voltage.

8. The device as claimed in any one of claims 5 to 7, wherein the diagnostic circuit is constructed in MOS technology.

* * * * *